(12) United States Patent
Iizuka et al.

(10) Patent No.: US 8,400,706 B2
(45) Date of Patent: Mar. 19, 2013

(54) ACOUSTO-OPTIC SCANNER

(75) Inventors: Hideo Iizuka, Ann Arbor, MI (US);
Nader Engheta, Berwyn, PA (US);
Hisayoshi Fujikawa, Seto (JP)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 119 days.

(21) Appl. No.: 13/079,441

(22) Filed: Apr. 4, 2011

(65) Prior Publication Data

US 2012/0250140 A1    Oct. 4, 2012

(51) Int. Cl.
*G02F 1/33* (2006.01)
(52) U.S. Cl. .................. 359/305; 359/313; 359/314
(58) Field of Classification Search .......... 359/305, 359/312, 313, 314
See application file for complete search history.

(56) References Cited

U.S. PATENT DOCUMENTS 7,580,182 B2 * 8/2009 Kump et al. ............... 359/307

OTHER PUBLICATIONS

R. Rimeika et al., "Diffraction of guided optical waves by surface acoustic waves in GaN", Appl. Phys. Lett., vol. 77, No. 4, pp. 480-482 (2000).
N. Savage, "Acousto-optic devices", Nature Photonics, vol. 4 (2010).
H. Iizuka et al., "Role of propagating modes in a double-groove grating with a +1st-order diffraction angle larger than the substrate-air critical angle", Opt. Lett. vol. 35, No. 23 (2010).
Isomet Corp., "Double Axis AO Deflector Off-Axis OAD-1121XY" Isomet, pp. 1-2, (2010).
B.E.A. Saleh et al., "Fundamentals of photonics", App. 1-4, 2nd ed., pp. 818-819 (2007).

* cited by examiner

*Primary Examiner* — David N Spector
(74) *Attorney, Agent, or Firm* — Christopher G. Darrow; Young Basile Hanlon & MacFarlane PC

(57) ABSTRACT

An acousto-optic laser beam scanner of improved scanning angle scope is provided by introducing a controllable compound acoustic waveform into a light transmissive body wherein at least binary and binary diffraction grating patterns of both positive and negative sense can be introduced into the body, the period of the waveform determining the refraction angle magnitude and the order of the pulses determining the refraction angle direction.

7 Claims, 2 Drawing Sheets

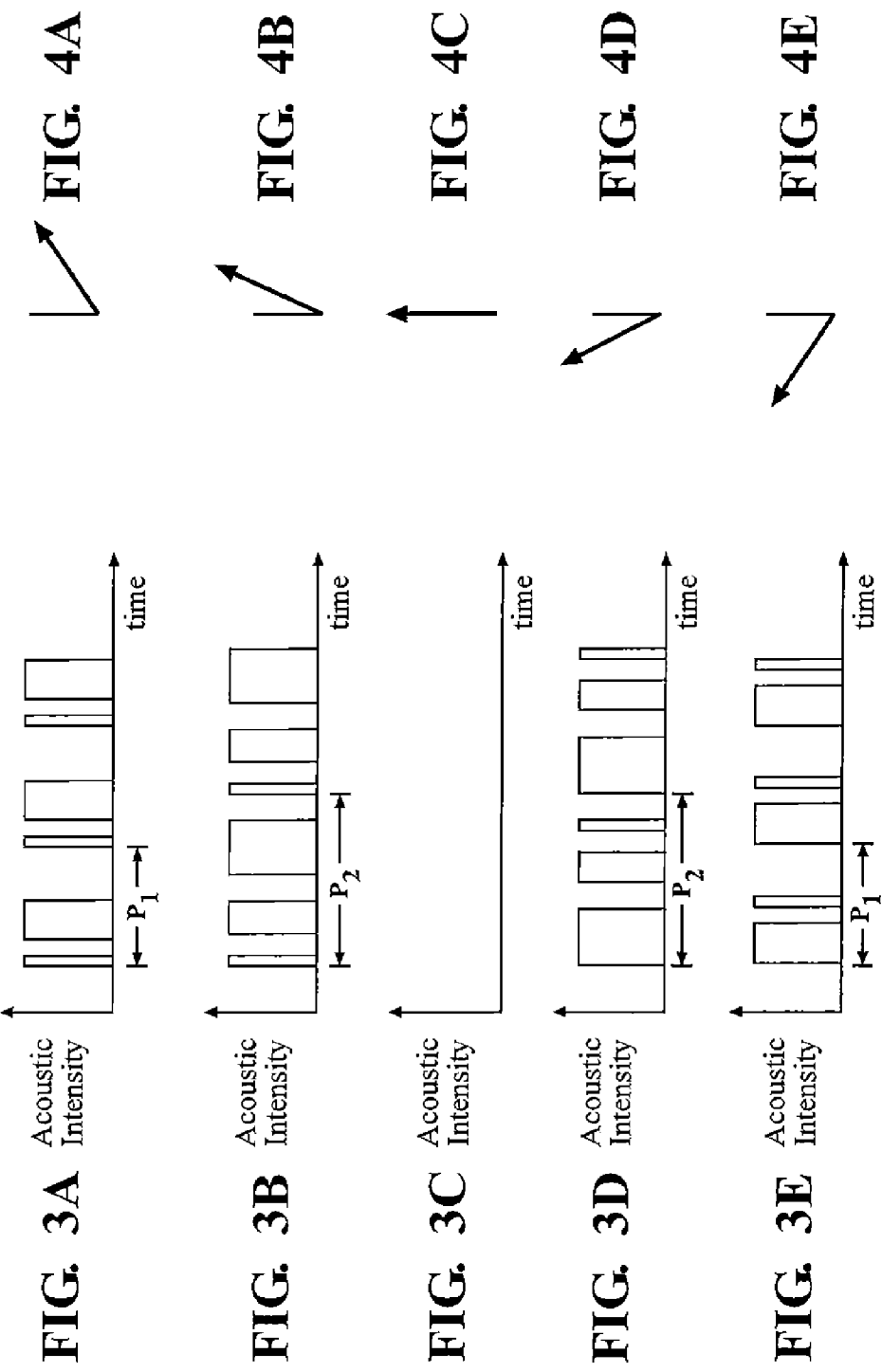

US 8,400,706 B2

ACOUSTO-OPTIC SCANNER

CROSS REFERENCE TO RELATED APPLICATIONS

This application claims the benefits of the utility patent application Ser. No. 12/855,844 for Optical Device using Double Groove Gratings, filed Aug. 13, 2010, the entire content of which is being incorporated herein by reference

FIELD OF THE INVENTION

This invention relates to acousto-optic devices and more particularly to an acousto-optic scanner for controllably redirecting a beam of polarized light.

BACKGROUND OF THE INVENTION

There are many practical applications for light beam scanners; for example, mechanical beam scanning techniques using polygon mirrors are found in automotive laser radars. It is, however, desirable to eliminate the mechanical movement which is inherent in such devices.

SUMMARY OF THE INVENTION

The present invention provides a scanner for polarized light which requires no mechanical movement and provides wide scanning angles. In general, the objectives of the invention are achieved using acousto-optic technology combined with synthesized multi-groove diffraction grating technology.

In an illustrative form of the invention hereinafter described in detail, a body of light transmissive material is arranged to receive incident polarized light and a controllable acoustic wave along a transverse axis, usually at right angles to the direction of incident light. An acoustic transducer is used to introduce an acoustic wave, typically in the frequency range of 60 MHz to 100 MHz to synthesize a diffraction grating in the body. As hereinafter described in detail, the acoustic waveform comprises periodic groups or sets or pulses of different widths so as to diffract the incident light through an angle which is related to the period of the acoustic waveform and wherein the direction of diffraction is controlled by the order in which the wider and narrower pulses appear in each set.

In accordance with the invention, the acousto-optic device described herein may also include an acoustic termination which may be either an absorber or a reflector. In the case of the absorber, a dynamic acoustic waveform is established in the body. In the case of a reflector, a standing wave may be induced in the body.

According to a second aspect of the invention, a method of scanning an incident beam of polarized light using a light transmissive body comprises the steps of directing a polarized beam onto the body along a first axis and introducing a compound acoustic waveform into the body along a second axis which intersects the first axis wherein the compound acoustic waveform is variable as to both pulse set period and pulse duration order.

Other advantages, features and characteristics of the present invention, as well as methods of operation and functions of the related elements of the structure, will become more apparent upon consideration of the following detailed description and the appended claims with reference to the accompanying drawings, the latter being briefly described hereinafter.

BRIEF DESCRIPTION OF THE DRAWINGS

The description herein makes reference to the accompanying drawings wherein like reference numerals refer to like parts throughout the several views and wherein:

FIG. 3 is a chart showing five different cases of acoustic input signals to the acousto-optic devices of FIGS. 1 and 2 with different periods of pulse sets and orders of pulse widths; and FIG. 4 is a chart showing several cases of beam scanning angles produced by the acoustic input pulses on the corresponding lines a-e in FIG. 4.

DETAILED DESCRIPTION OF THE ILLUSTRATIVE EMBODIMENT

Figure 1:
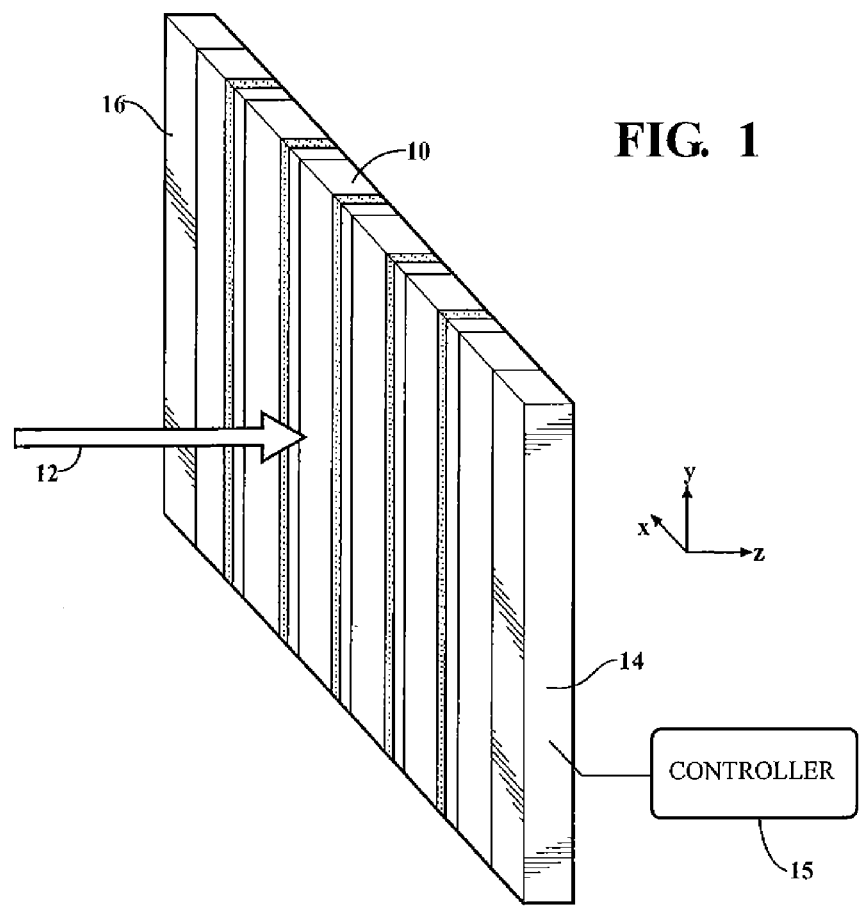
FIG. 1 is a perspective view of an acousto-optic scanner in accordance with the invention.
Figure 2:
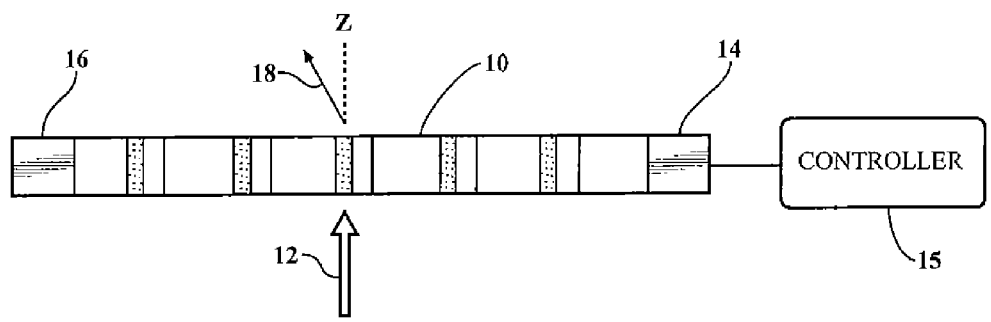
FIG. 2 is a top view of the device of FIG. 1 showing how the incident light beam is refracted in a direction and to a degree which is dependent upon the order of the narrow and wide pulses introduced into the light transmissive body by an acoustic transducer.

Referring to FIGS. 1 and 2, there is shown an acousto-optic scanner comprising a generally rectangular body 10 of light transmissive material such as $SiO_2$, $TiO_2$ or GaN layered on a sapphire substrate. The thickness of the body 10 is on the order of 280 nm; the height and width are non-critical and will be selected to suit the particular application. Polarized light 12 is incident upon the left-hand major planar surfaces of the body 10 as shown in FIGS. 1 and 2. The incident light is refracted at an angle along the X-axis which, as shown in FIG. 1, is a generally lateral axis extending through the body 10 from right to left. The degree of the function of the content of an acoustic waveform introduced into the body 10 by an acoustic device 14 refraction is which is coupled to the right edge of the body 10 as shown in FIGS. 1 and 2. The acoustic device 14 may take a number of different forms, an example of which is a piezoelectric crystal connected to a programmable source 15 of acoustic frequency pulses in the megahertz range; i.e., from about 60 MHz to about 100 MHz as described above.

Bonded to the opposite edge of the body 10 is a termination device 16 which may be an acoustic absorber which fully attenuates the acoustic waveform introduced into the body 10 and propagating across the body across the transducer 14 to the termination 16. Alternatively, the termination 16 may be a reflector which is used to reflect the acoustic wave and produce a standing pattern in the diffraction body 10.

In accordance with the invention, the acoustic waveform which is introduced into the body 10 by the transducer 14 consists of sets of pulses with different widths occurring with a regular period and in a consistent order. To produce a negative refraction angle, the narrow pulses regularly precede the wider pulses. When a refraction or (scanning) angle of opposite sense is desired, the wider pulses precede the narrower pulses. In addition, the period of the pulse sets is controlled to select the magnitude of the scanning angle, these factors being illustrated in the five case examples of FIGS. 3 and 4. In a practical application, controller 15 responds to a measured quantity to select the pulse order and period.

In FIG. 3, all of the lines a-e illustrate acoustic waveforms except line C which illustrates the case of no input acoustic waveform thereby producing no change of the angle of the normal incident light as it emerges at 18 from the body 10; i.e., the normal incident light continues through the body 10 along the Z-axis. In the case of FIG. 3A, the pulse sets have a period P1 and are of a binary character wherein the narrow pulses in each set precede wider pulses thereby to synthesize a double-groove diffraction grating having functional properties as generally set forth in our co-pending application U.S. application Ser. No, 12/855,844 filed Aug. 13, 2010, currently pending. The entire content of the U.S. patent application Ser. No. 12/855,844 is incorporated herein by reference. As shown in FIG. 4A, this input acoustic waveform produces a large scanning angle which may also be referred to as a large refraction angle in the negative direction along the X-axis.

As the period of the input waveform becomes longer, as shown in FIG. 3B, more pulses are added to the set and the refraction angle is smaller as shown on line B of FIG. 4. The period P2 of the trinary pulse sets in FIG. 3B is greater or longer than the period P1 of the binary pulse sets in FIG. 3A.

As stated above, FIGS. 3C and 4C illustrate the case of no input acoustic waveform wherein light is transmitted through the body 10 along the Z-axis without any refraction (scanning) angle. This light-through case also works by a much shorter period in the grating pattern; i.e., an anti-reflection grating.

Lines D of FIGS. 3 and 4 illustrate the case wherein the trinary pulse groups occur in reverse order; i.e., the greater width pulses precede the narrower width pulses thereby producing a refraction angle in the positive X direction. Again, because the period P2 is relatively long, the refraction angle is small.

FIGS. 3E and 4E illustrate the case wherein a binary pulse set having a shorter period P1 is used to excite the acousto-optic body 10 thereby producing a large refraction angle. The physical character is the transducer 14 and the controller 15 which is used in combination therewith will determine the magnitude and direction of the refraction angle which is used as the scanning angle in a practical device.

It is to be understood that the invention has been desired with reference to a specific embodiment to satisfy the Patent Laws and that various changes, additions and application of the invention may occur to those skilled in the acousto-optic art.

What is claimed is:

1. A light beam scanner comprising:
    a light transmissive body having an incident light axis and an acoustic signal input axis transverse to the incident light axis; and
    means for introducing a controllable acoustic waveform into the body along said acoustic signal axis to establish in said body a periodic refractive pattern of compound pulse width content and controllable pulse order;
    wherein said means is configured to produce a compound waveform consisting of a periodic pattern of longer and shorter pulses in at least binary sets, wherein the longer pulses precede the shorter pulses in each pulse set to diffract the input light in a first direction, and wherein the shorter pulses precede the longer pulses in each pulse set thereby to diffract the input light in a second direction.

2. A light beam scanner as defined in claim 1 further including an acoustic termination associated with said body along said acoustic axis and opposite said beams for introducing.

3. A light beam scanner as defined in claim 2 wherein said termination is non-reflective so as to attenuate the acoustic waveform.

4. A light beam scanner as defined in claim 2 wherein the acoustic termination is reflective.

5. A light beam scanner as defined in claim 2 wherein the acoustic waveform has a frequency in the range of about 60 MHz to 100 MHz.

6. A method of scanning an incident beam of polarized light using a light transmissive body comprising the steps of:
    a) directing said beam onto said body along a first axis; and
    b) introducing a compound acoustic waveform into the body along a second axis transverse to the first axis thereby to establish in said substrate a periodic diffraction grating pattern having periodic sets of synthesized grating elements of at least first and second widths;
    c) wherein the pulses of longer width occur in each set prior to the pulses of the shorter width to diffract the beam in one direction and wherein the shorter pulses precede in each set the pulses of longer width to diffract the beam in a second direction.

7. A method as defined in claim 6 further including the step of reflecting the acoustic waveform from one end of the body back into the body so as to establish a standing wave.

* * * * *

UNITED STATES PATENT AND TRADEMARK OFFICE
CERTIFICATE OF CORRECTION

| | | |
|---|---|---|
| PATENT NO. | : 8,400,706 B2 | Page 1 of 1 |
| APPLICATION NO. | : 13/079441 | |
| DATED | : March 19, 2013 | |
| INVENTOR(S) | : Hideo Iizuka et al. | |

It is certified that error appears in the above-identified patent and that said Letters Patent is hereby corrected as shown below:

On the Title page, in item (73) Assignee, please add a second assignee --The Trustees of the University of Pennsylvania, Philadelphia, PA (US)--.

Signed and Sealed this
Seventeenth Day of September, 2013

Teresa Stanek Rea
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,400,706 B2 | Page 1 of 1 |
| APPLICATION NO. | : 13/079441 | |
| DATED | : March 19, 2013 | |
| INVENTOR(S) | : Hideo Iizuka et al. | |

It is certified that error appears in the above-identified patent and that said Letters Patent is hereby corrected as shown below:

Title page, item [57] Abstract: line 4; delete the second instance of "binary" and insert -- trinary --, therefor.

In the Specification

Column 4, line 14; delete "beams" and insert -- means --, therefor.

Signed and Sealed this
Nineteenth Day of November, 2013

Teresa Stanek Rea
*Deputy Director of the United States Patent and Trademark Office*